(12) United States Patent
Yasuda

(10) Patent No.: US 7,645,954 B2
(45) Date of Patent: Jan. 12, 2010

(54) TRANSPARENT CONDUCTOR AND PANEL SWITCH

(75) Inventor: Noriyuki Yasuda, Tokyo (JP)

(73) Assignee: TDK Corporation, Tokyo (JP)

( * ) Notice: Subject to any disclaimer, the term of this patent is extended or adjusted under 35 U.S.C. 154(b) by 143 days.

(21) Appl. No.: 11/475,915

(22) Filed: Jun. 28, 2006

(65) Prior Publication Data

US 2007/0182457 A1    Aug. 9, 2007

(30) Foreign Application Priority Data

Jun. 30, 2005    (JP) .............................. 2005-193032

(51) Int. Cl.
*H01H 9/00*    (2006.01)
(52) U.S. Cl. ..................................... 200/314
(58) Field of Classification Search .................. 200/314
See application file for complete search history.

(56) References Cited

U.S. PATENT DOCUMENTS

| | | | |
|---|---|---|---|
| 6,677,926 B2 * | 1/2004 | Biegelsen ................... | 345/107 |
| 6,723,933 B2 * | 4/2004 | Haag et al. ................ | 200/61.42 |
| 6,800,368 B2 * | 10/2004 | Shigehiro et al. ........... | 428/403 |
| 7,196,281 B2 * | 3/2007 | Cok et al. .................... | 200/512 |
| 7,268,311 B2 * | 9/2007 | Tanabe et al. ................ | 200/314 |

FOREIGN PATENT DOCUMENTS

| | | |
|---|---|---|
| JP | A 63-077735 | 4/1988 |
| JP | A 11-291383 | 10/1999 |
| JP | A 2004-331796 | 11/2004 |

OTHER PUBLICATIONS

English-Language Translation of Japanese Office Action (Notice of Reasons for Rejection), Sep. 8, 2009, pp. 1-3.

* cited by examiner

*Primary Examiner*—Michael A Friedhofer
*Assistant Examiner*—Lheiren Mae A Anglo
(74) *Attorney, Agent, or Firm*—Oliff & Berridge, PLC

(57) ABSTRACT

The present invention provides a transparent conductor comprising a successive lamination of a support, a conductive particle layer containing a conductive particle and a first binder, and a conductive film layer containing a bead and a second binder; wherein a surface of the conductive film layer opposite from the conductive particle layer is rough.

12 Claims, 4 Drawing Sheets

TRANSPARENT CONDUCTOR AND PANEL SWITCH

BACKGROUND OF THE INVENTION

1. Field of the Invention

The present invention relates to a transparent conductor and a panel switch.

2. Related Background Art

In general, a panel switch such as touch panel is constructed by a pair of transparent electrodes opposing each other and a spacer held between the pair of transparent electrodes. When one of the transparent electrodes is pushed in such a panel switch, this transparent electrode comes into contact with the other transparent electrode, so as to conduct electricity, whereby the position of the point of contact is detected. Employed as the transparent electrode is a transparent conductor, examples of which include one forming a sputtered film as a conductive layer on a support and one made of a conductive particle and a binder.

However, such a panel switch has been problematic in that, when one transparent conductor is pushed, the transparent conductor is distorted, whereby light incident on and transmitted through the transparent conductor and light reflected by the other transparent conductor interfere with each other, thereby generating interference fringes (Newton's rings).

In view of this problem, a transparent conductive film which can restrain Newton's rings from occurring has been disclosed (see Japanese Patent Application Laid-Open No. HEI 11-291383). This transparent conductive film comprises two or more hardcoat layers laminated and formed on one surface of a transparent base film, whereas a transparent conductive layer is formed by DC sputtering on the outermost hardcoat layer in the two or more hardcoat layers. The outermost hardcoat layer contains particles while having a thickness smaller than the average particle size of the particles, whereby this transparent conductive film restrains Newton's rings from occurring.

SUMMARY OF THE INVENTION

However, the transparent conductive layer is provided by DC sputtering on the outermost surface of the transparent conductive film disclosed in the above-mentioned Japanese Patent Application Laid-Open No. HEI 11-291383, ant thus is a hard layer. When the above-mentioned transparent conductive film is used as a transparent electrode for a panel switch such as touch panel, a pair of transparent electrodes are arranged such that the transparent conductive layers oppose each other. When one of the transparent electrodes is pushed in this state, this transparent electrode is distorted, while the transparent conductive layers come into contact with each other. Therefore, cracks are likely to occur in the transparent conductive layers, whereby the transparent conductive layers may be broken. This may change the electric resistance value of the transparent electrode.

In view of the foregoing circumstances, it is an object of the present invention to provide a transparent conductor which can restrain Newton's rings from occurring and suppress the change in electric resistance value, and a panel switch using the same.

The inventors conducted diligent studies in order to overcome the problem mentioned above and, as a result, have presumed that providing a conductive particle layer within a transparent conductor while arranging a conductive layer having a rough surface on the outermost surface of the transparent conductor may restrain light transmitted through one transparent conductor from being reflected by the other transparent conductor and thereby interfering with light incident on the latter transparent conductor, and suppress the change in electric resistance value. As a result of further studies based on this presumption, the inventors have found that the following invention can solve the above-mentioned problem, thereby completing the present invention.

In one aspect, the present invention provides a transparent conductor (which may also be referred to as "first transparent conductor" for convenience in the following) comprising a successive lamination of a support, a conductive particle layer containing a conductive particle and a first binder, and a conductive film layer containing a bead and a second binder, wherein a surface of the conductive film layer opposite from the conductive particle layer is rough.

The first transparent conductor has a three-layer structure of the support, conductive particle layer, and conductive film layer. The conductive particle layer is held between the support and the conductive film layer, while the conductive particle is fixed by the first binder. Therefore, even when the transparent conductor is distorted, or the transparent conductors come into contact with each other, the conductive film layer acts as a buffer film, so as to restrain the conductive particle layer from causing cracks or breaking in the first transparent conductor. Since the conductive particle layer contains the fixed conductive particle, the first transparent conductor secures conductivity.

The conductive film layer, which is the outermost layer of the first transparent conductor, is constructed such that the bead is fixed by the second binder, and has a rough surface. Therefore, when a transparent conductor is arranged so as to oppose the first transparent conductor by way of a spacer, light transmitted through the transparent conductor opposing the first transparent conductor is dispersed by the roughness in the surface of the first transparent conductor, and the shortest distance between opposing transparent conductors is regulated by the rough surface, so as to reduce continuous reflection occurring between the transparent conductors, whereby Newton's rings are restrained from occurring. The conductive film layer is laminated on the conductive particle layer. Therefore, even if the conductive film layer is broken, the conductive particle layer will not be broken, whereby the electric resistance value can fully be kept from changing.

Hence, the first transparent conductor of the present invention can restrain Newton's rings from occurring, and can suppress the change in electric resistance value.

Preferably, the bead comprises a resin. When the bead comprises a resin, the bead can attain an excellent flexibility. The bead in this case also acts as a buffer material. As a result, even when transparent conductors come into contact with each other, the first transparent conductor can more strongly keep it from breaking and attains an excellent durability when used in a long period.

Preferably, the resin comprises a conductive polymer. Even when the second binder is worn out so that the bead is exposed, the resin made of a conductive polymer can sufficiently maintain electric conduction and restrain the electric resistance value from changing.

In another aspect, the present invention provides a transparent conductor (which may also be referred to as "second transparent conductor" for convenience in the following) comprising a support and a conductive particle layer containing a conductive particle and a first binder; wherein a conductive part containing a second binder is arranged like a dot on a side of the conductive particle layer opposite from the support.

The second transparent conductor has a two-layer structure made of a support and a conductive particle layer, whereas a conductive part is formed like a dot on the side of the conductive particle layer opposite from the support and contains the second binder. Therefore, even when the transparent conductor is distorted, or the transparent conductors come into contact with each other, the conductive part acts as a buffer material, so as to restrain the conductive particle layer from breaking. Also, the conductive particle layer contains a fixed conductive particle. Therefore, the second transparent conductor secures conductivity.

Since the conductive part is arranged like a dot, the second transparent conductor has a rough surface. Therefore, when a transparent conductor is arranged so as to oppose the second transparent conductor by way of a spacer, light transmitted through the transparent conductor opposing the second transparent conductor is dispersed by the roughness in the surface of the second transparent conductor, and the shortest distance between opposing transparent conductors is regulated by the rough surface, so as to reduce continuous reflection occurring between the transparent conductors, whereby Newton's rings are restrained from occurring. The conductive part is formed on the conductive particle layer. Therefore, even if the conductive part is broken, the conductive particle layer will not be broken, whereby the second transparent conductor of the present invention can fully keep the electric resistance value from changing.

Hence, the second transparent conductor of the present invention can restrain Newton's rings from occurring, and can suppress the change in electric resistance value.

Preferably, in the above-mentioned first and second transparent conductors, the second binder comprises a conductive polymer. When the second binder is a conductive polymer, the conductive film layer or conductive part becomes excellent in conductivity.

In still another aspect, the present invention provides a panel switch comprising a pair of transparent conductors opposing each other, and a spacer provided between the pair of transparent conductors, wherein at least one of the pair of transparent conductors is any of the transparent conductors mentioned above.

The panel switch such as touch panel uses the above-mentioned transparent conductor, and thus can restrain Newton's rings from occurring and can sufficiently suppress the change in electric resistance value.

Preferably, in the panel switch, a plurality of beads and spacers are arranged at respective fixed intervals, while the interval between the beads is shorter than the interval between the spacers. Here, the interval refers to the shortest distance between the adjacent beads or adjacent spacers. This can restrain Newton's rings from occurring and reliably secure a conduction path.

The first and second transparent conductors in the present invention encompass film- and sheet-like transparent conductors, in which the film-like transparent conductors refer to those having a thickness falling within the range of 50 nm to 1 mm, whereas the sheet-like transparent conductors refer to those having a thickness exceeding 1 mm.

DESCRIPTION OF THE PREFERRED EMBODIMENTS

Figure 1:
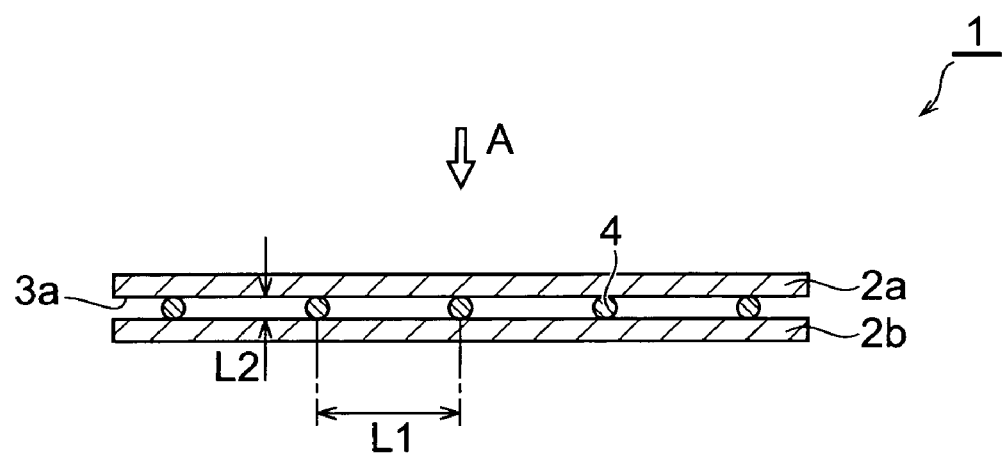
FIG. 1 is a schematic sectional view showing a touch panel which is an embodiment of the panel switch in accordance with the present invention.

In the following, preferred embodiments of the present invention will be explained in detail with reference to the drawings as necessary. Ratios of sizes in the drawings are not limited to those depicted.

First Embodiment

FIG. 1 is a schematic sectional view showing a touch panel which is a preferred embodiment of the panel switch in accordance with the present invention. As shown in FIG. 1, the touch panel 1 in accordance with this embodiment is constructed by a pair of transparent conductors (transparent electrodes) 2$a$ and 2$b$ opposing each other, and a plurality of dot spacers 4 held between the transparent conductors 2$a$ and 2$b$.

Preferably, in the touch panel 1, the interval L1 between the dot spacers 4 is 0.5 to 5 mm on average, whereas the interval L2 between the pair of transparent conductors 2$a$, 2$b$ opposing each other is 3 to 20 μm on average. This can prevent the opposing transparent conductors 2$a$, 2$b$ from coming into contact with each other when no pressure is applied thereto.

In the touch panel 1, the transparent conductors 2$a$, 2$b$ are arranged such that a conductive film layer 13 which will be explained later is on the side of a surface 3$a$ where the transparent conductors 2$a$, 2$b$ come into contact with each other. In the touch panel 1, one transparent conductor 2$a$ is pushed in the direction of arrow A so as to come into contact with the other transparent conductor 2$b$, thereby conducting electricity, and this position is detected. Therefore, when the surface of the touch panel 1 is pushed, a distortion occurs in the transparent conductor 2$a$, while the opposing transparent conductors 2$a$, 2$b$ come into contact with each other.

The transparent conductor 2$a$ will now be explained. The transparent conductor 2$b$ may be constructed as with the transparent conductor 2$a$ or a known transparent conductor.

Figure 2:
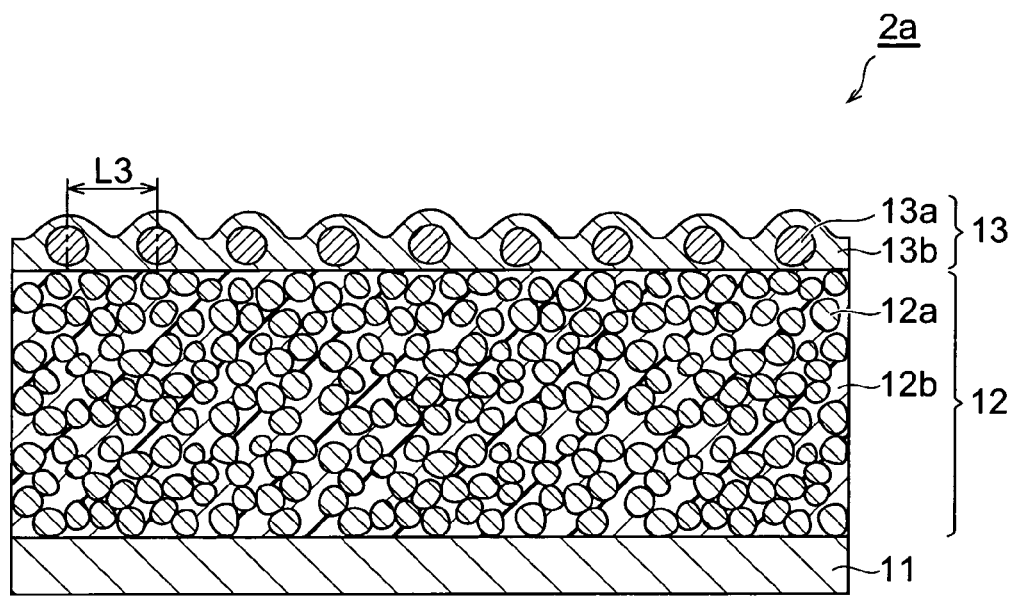
FIG. 2 is a schematic sectional view showing a first embodiment of the transparent conductor in accordance with the present invention.

FIG. 2 is a schematic sectional view showing a first embodiment of the transparent conductor in accordance with the present invention. As shown in FIG. 2, the transparent conductor 2$a$ comprises a support 11, a conductive particle layer 12 containing conductive particles 12$a$ and a first binder 12$b$, and a conductive film layer 13 containing beads 13$a$ and a second binder 13$b$,while these layers are laminated in this order.

The transparent conductor 2$a$ is constructed such that the conductive particle layer 12 is held between the support 11 and conductive film layer 13. Therefore, even when the transparent conductor 2$a$ is distorted, or the transparent conductors 2$a$, 2$b$ come into contact with each other, the conductive film layer 13 acts as a buffer layer in the transparent conductor 2$a$, thereby restraining the conductive particle layer 12 from causing cracks and breaking. Since the conductive particle layer 12 contains the conductive particles 12$a$, the transparent conductor 2$a$ secures conductivity.

The conductive film layer 13, which is the outermost layer of the transparent conductor 2$a$, has such a structure that the beads 13$a$ are fixed by the second binder 13$b$. In the conductive film layer 13, the second binder 13$b$ has substantially the same thickness on the surface of the beads 13$a$ and on the surface of the conductive particle layer 12. Since the beads 13a and binder 13b have refractive indexes different from each other, incident light is scattered. The conductive film layer 13 contains the beads 13a, and thus has a rough surface. Therefore, by scattering the light transmitted through the transparent conductor 2a and the light reflected by the opposing transparent conductor 2b with the rough surface, the transparent conductor 2a restrains Newton's rings from occurring. Since the conductive film layer 13 is laminated on the conductive particle layer 12, the electric resistance value can be kept from changing even when the conductive film layer 13 is broken.

Therefore, the transparent conductor 2a in accordance with this embodiment can restrain Newton's rings from occurring and suppress the change in electric resistance value.

The conductive film layer 13, conductive particle layer 12, and support 11 will now be explained in further detail.

Conductive Film Layer

The transparent conductor in accordance with this embodiment has the conductive film layer 13, which contains beads 13a and second binder 13b.

Examples of the beads 13a include resins such as aramide, polystyrene, acrylic, epoxy, polycarbonate, polyolefin, polyester, polyurethane, gelatin, cellulose, gum arabic, fluorine-based resins, polyacetylene, polypyrrole, polythiophene, polyphenylenevinylene, polyfluorene, and polyaniline; and inorganic substances such as silica, glass, alumina, zirconia, titania, ITO, tin oxide, and zinc oxide.

Among them, resins such as acrylic, polyolefin, polyurethane, polythiophene, and polypyrrole are preferably used. When made of a resin, the beads 13a can become excellent in flexibility. The beads 13a in this case act as a buffer material. As a result, even if transparent conductors 2a, 2b come into contact with each other, the transparent conductor 2a can be restrained from breaking and attain an excellent durability when used in a long period.

Among the above-mentioned resins, conductive polymers such as polythiophene and polypyrrole are more preferable. In this case, even when the second binder 13b is worn out so that the beads 13a are exposed, electric conduction can sufficiently be maintained, whereby the electric resistance value can be restrained from changing.

Among the above-mentioned conductive polymers, polythiophene is more preferable. This can restrain the electric resistance value from changing and can also improve the transparency of the transparent conductor 2a.

From the viewpoint of securing the transparency, inorganic beads such as silica, glass, ITO, tin oxide, and zinc oxide are preferably used as the beads 13a.

Examples of forms of the beads 13a include spheres and hemispheres. When the beads 13a have a spherical form, their diameter is preferably 3 to 5 μm. The beads 13a having a diameter of 3 to 5 μm can make the surface of the conductive film layer 13 rougher, more strongly keep Newton's rings from occurring, and improve the transmittance and haze value more than in the case where the diameter is outside of this range.

Employable as the second binder 13b are conductive polymers such as polyacetylene, polypyrrole, polythiophene, polyphenylenevinylene, polyphenylene, polysilane, polyfluorene, and polyaniline; acrylic resins; epoxy resins; and the like. Cured photocurable and thermosetting compounds can also be used. The photocurable compounds may be any organic compounds as long as they are curable by light, whereas the thermosetting compounds may be any organic compounds which are curable by heat. Here, the organic compounds encompass those containing a substance to become a material for the above-mentioned resins, whereas their specific examples include monomers, dimers, trimers, and oligomers which can form the resins.

Preferred among them are conductive polymers such as polythiophene and polypyrrole. The second binder 13b made of a conductive polymer makes the conductive film layer 13 excellent in conductivity. Therefore, in this case, the transparent conductor 2a can secure electric conduction and become excellent in sensitivity.

More preferable among the conductive polymers is polythiophene. This can improve the transparency of the transparent conductor 2a.

From the viewpoint of transparency, the second binder 13b is preferably an acrylic resin.

The above-mentioned conductive film layer 13 is conductive. In this embodiment, it will be sufficient if one of the beads 13a and second binder 13b is conductive, but it will be more preferable if both of them are conductive.

When none of the beads 13a and second binder 13b is conductive, the conductive film layer 13 further contains a conductive substance such as conductive filler, conductive whisker, or carbon nanotube. Examples of the conductive filler or conductive whisker include ITO, tin oxide, and zinc oxide. For improving the conductivity, the conductive filler and whisker may be doped with one or a plurality of kinds of elements.

The maximum height (Rmax) of the conductive film layer 13 is preferably 700 to 3,500 nm. Here, the Rmax refers to a value measured in conformity to JIS B 0601-1982, and can be measured by a surface roughness meter. The maximum height of 700 to 3,500 nm more fully keeps Newton's rings from occurring and improves the transparency more than in the case where the maximum height is on the outside of the range mentioned above.

Preferably, the conductive film layer 13 has a refractive index of 1.6 or less. When the refractive index is less than 1.6, the reflectance becomes lower than in the case where the refractive index is 1.6 or greater, whereby the transparency tends to improve.

Preferably, the conductive film layer 13 has a thickness of 0.5 to 3 μm. When the thickness is 0.5 to 3 μm, damages are less like to occur, the Rmax decreases less, and Newton's rings are more fully kept from occurring as compared with the case where the thickness is outside of the range mentioned above.

Preferably, in the conductive film layer 13, the interval L3 between adjacent beads is 10 to 200 μm on average. The interval L3 of 10 to 200 μm improves optical characteristics (transmittance and haze value) more, and more fully keeps Newton's rings from occurring as compared with the case where the interval L3 is outside of the range mentioned above.

Preferably, the conductive film layer 13 has a Tg of 0° C. or higher. The Tg of 0° C. or higher can maintain the morphology of the transparent conductor 2a even when the transparent conductor 2a in accordance with the present embodiment is used for a long period. Here, the Tg refers to a value measured at a heating rate of 20° C./min by DSC.

The conductive film layer 13 may further contain additives as necessary. Examples of the additives include lubricants, dispersing agents, leveling agents, and plasticizers.

Conductive Particle Layer

The transparent conductor 2a in accordance with this embodiment has the conductive particle layer 12, whereas the conductive particle layer 12 contains the conductive particles 12a and first binder 12b. The conductive particles 12a are filled such that the adjacent conductive particles 12a are in contact with each other. This allows the transparent conductor 2a to conduct electricity.

The conductive particles 12a are constructed by a transparent conductive oxide material. The transparent conductive oxide material is not restricted in particular as long as it is transparent and conductive. Examples of the transparent conductive oxide material include indium oxide; indium oxide doped with at least one species of elements selected from the group consisting of tin, zinc, tellurium, silver, gallium, zirconium, hafnium, and magnesium; tin oxide; tin oxide doped with at least one species of elements selected from the group consisting of antimony, zinc, and fluorine; zinc oxide; and zinc oxide doped with at least one species of elements selected from the group consisting of aluminum, gallium, indium, boron, fluorine, and manganese.

Preferably, the conductive particles 12a have an average particle size of 10 nm to 80 nm. When the average particle size is 10 nm to 80 nm, the conductivity of the transparent conductor 2a is harder to fluctuate than in the case where the average particle size is outside of the range mentioned above. Namely, while oxygen defects occurring in the conductive particles 12a generate conductivity in the transparent conductor 2a in accordance with this embodiment, the oxygen defects are prevented from decreasing, for example, when the external oxygen concentration is high in the case where the conductive particles 12a have a particle size of 10 nm or more, whereby the conductivity is more fully prevented from fluctuating. The average particle size of 80 nm or less tends to make light scattering less, prevent the transmittance of the transparent conductor 2a from decreasing in the visible light wavelength region, and lower the haze value as compared with the case where the average particle size exceeds 80 nm.

Preferably, the filling ratio of the conductive particles 12a in the conductive particle layer 12 is 10 vol % to 70 vol %. When the filling ratio is less than 10 vol %, the electric resistance value of the transparent conductor 2a tends to become higher than in the case where the filling ratio falls within the range mentioned above. When the filling ratio exceeds 70 vol %, the mechanical strength of the conductive particle layer 12 tends to decrease as compared with the case where the filling ratio falls within the range mentioned above.

When the average particle size and filling ratio of the conductive particles 12a thus fall within their corresponding ranges mentioned above, the transparent conductor 2a can further improve its transparency and lower its initial electric resistance value.

Preferably, the conductive particles 12a have a specific surface area of 10 $m^2/g$ to 50 $m^2/g$. When the specific surface area is less than 10 $m^2/g$, the scattering of visible light tends to become greater than in the case where the specific surface area falls within the range mentioned above. When the specific surface area exceeds 50 $m^2/g$, the transparent conductor 2a tends to lower its stability as compared with the case where the specific surface area falls within the range mentioned above. Here, the specific surface area refers to a value measured by a specific surface area measuring apparatus (type: NOVA2000 manufactured by Quantachrome Instruments) after drying a sample in vacuum for 30 minutes at 300° C.

Acrylic resins, epoxy resins, and the like can be used as the first binder 12b. Cured photocurable and thermosetting compounds can also be used. The photocurable compounds may be any organic compounds as long as they are curable by light, whereas the thermosetting compounds may be any organic compounds which are curable by heat. Here, the organic compounds encompass those containing a substance to become a material for the binder 12b, whereas their specific examples include monomers, dimers, trimers, and oligomers which can form the first binder 12b.

Preferred among them are acrylic resins. In this case, the conductive particle layer has a high transparency and thus is excellent in transmittance.

Preferably, the first binder 12b is a photocurable compound. When the curable compound is a photocurable compound, its curing reaction can be controlled, while it can be cured in a short time, which is advantageous in that the process management becomes simpler.

As the photocurable compound, monomers containing vinyl and epoxy groups or their derivatives and the like can favorably be used. They may be used singly or in mixtures of two or more species.

Preferably, the conductive particle layer 12 has a refractive index of 1.6 or less. When the refractive index is less than 1.6, the reflectance becomes lower than in the case where the refractive index is 1.6 or greater, whereby the transparency tends to improve.

Preferably, the conductive particle layer 12 has a thickness of 0.1 to 5 μm. When the thickness is 0.1 to 5 μm, the resistance value is more stabilized, and the transparency improves more as compared with the case where the thickness is outside of the range mentioned above.

Preferably, the conductive particle layer 12 has a Tg of 30° C. or higher. The Tg of 30° C. or higher can maintain the morphology of the transparent conductor 2a even when the transparent conductor 2a in accordance with the present embodiment is used for a long period.

The conductive particle layer 12 may further contain additives as necessary. Examples of the additives include flame retardants, UV-absorbing agents, colorants, and plasticizers.

Support

The support 11 is not limited in particular as long as it is constructed by a material transparent to high-energy lines which will be explained later and visible light. Namely, the support 11 may be a known transparent film. Examples of such a transparent film include films of polyesters such as polyethylene terephthalate (PET), films of polyolefins such as polyethylene and polypropylene, polycarbonate films, acrylic films, and norbornene films (e.g., ARTON manufactured by JSR Corporation). Not only the resin films, but glass may also be used as the support 11.

Preferably, the support 11 is made of a resin alone. This makes the transparent conductor 2a more excellent in transparency and bendability than in the case where the support 11 contains a resin and other components. Therefore, it is effective in particular for use in panel switches such as touch panels, for example.

Intermediate layers may further be provided between the support 11 and conductive particle layer 12. The number of intermediate layers is not limited in particular, whereas they may be provided as necessary. Examples of the intermediate layers include layers functioning as buffer layer, conductive auxiliary layer, dispersion prevention layer, UV-blocking layer, coloring layer, and polarizing layer. Preferably, these layers are constructed by a resin, an inorganic oxide, or their composite.

The touch panel 1 in accordance with this embodiment employs the transparent conductor 2a as such, and thus can sufficiently restrain Newton's rings from occurring and suppress the change in electric resistance value.

Preferably, in the touch panel 1, a plurality of beads 13a and spacers 4 are arranged at respective fixed intervals, while the interval L3 between the beads 13a is shorter than the interval L1 between the spacers 4. This can restrain Newton's rings from occurring and secure a conduction path.

Manufacturing Method

A method of manufacturing the transparent conductor $2a$ in accordance with this embodiment in the case using tin-doped indium oxide (hereinafter referred to as "ITO") as the above-mentioned conductive particles will now be explained.

To begin with, a conductive particle layer 12 containing conductive particles $12a$ and a first binder $12b$ is formed on a glass substrate which is not depicted. A method of forming the conductive particle layer 12 will now be explained.

First, indium chloride and tin chloride are coprecipitated by neutralization with an alkali (precipitating step). Here, the salt yielded as a byproduct is eliminated by decantation or centrifugation. Thus obtained coprecipitate is dried, and the resulting dried product is fired in an atmosphere and pulverized. This manufactures conductive particles $12a$. It will be preferred from the viewpoint of controlling oxygen defects if the firing is performed in a nitrogen atmosphere or in an atmosphere of a rare gas such as helium, argon, or xenon.

Thus obtained conductive particles $12a$ and first binder $12b$ are mixed and dispersed into a liquid, so as to yield a dispersion liquid. Examples of the liquid for dispersing the conductive particles $12a$ and first binder $12b$ include saturated hydrocarbons such as hexane; aromatic hydrocarbons such as toluene and xylene; alcohols such as methanol, ethanol, propanol, and butanol; ketones such as acetone, methylethylketone, isobutylmethylketone, and diisobutylketone; esters such as ethyl acetate and butyl acetate; ethers such as tetrahydrofuran, dioxane, and diethyl ether; and amides such as N,N-dimethylacetamide, N,N-dimethylformamide, and N-methylpyrrolidone. The first binder $12b$ may be dissolved in the liquid instead of being dispersed therein.

Thus obtained dispersion liquid is applied onto the glass substrate, so as to yield the conductive particle layer 12. Preferably, after coating, a drying process is performed. Examples of the coating method include reverse rolling, direct rolling, blading, knifing, extrusion, nozzle method, curtaining, gravure rolling, bar coating, dipping, kiss coating, spin coating, squeezing, and spraying.

Subsequently, a support 11 is attached onto the conductive particle layer 12. The support 11 may be provided beforehand with an anchor layer on the surface to be attached to the conductive particle layer 12. The anchor layer provided beforehand on the support 11 allows the conductive particle layer 12 to be fixed onto the support 11 more firmly through the anchor layer. Polyurethane and the like are favorably used as the anchor layer.

When a photocurable compound is used as the first binder $12b$, the photocurable compound is cured by irradiation with high-energy lines from above the support 11 provided on the conductive particle layer 12. Examples of the high-energy lines include UV rays, electron beams, γ-rays, and x-rays.

Next, a multilayer body composed of the conductive particle layer 12 and support 11 is peeled off from the glass substrate, and the resulting peeled surface (conductive particle layer surface) is formed with a conductive film layer 13.

First, the beads $13a$ and second binder $13b$ are mixed and dispersed into a liquid, so as to yield a dispersion liquid. Examples of the liquid for dispersing the beads $13a$ and second binder $13b$ include saturated hydrocarbons such as hexane; aromatic hydrocarbons such as toluene and xylene; alcohols such as methanol, ethanol, propanol, and butanol; ketones such as acetone, methylethylketone, isobutylmethylketone, and diisobutylketone; esters such as ethyl acetate and butyl acetate; ethers such as tetrahydrofuran, dioxane, and diethyl ether; and amides such as N,N-dimethylacetamide, N,N-dimethylformamide, and N-methylpyrrolidone. The second binder $13b$ may be dissolved in the liquid instead of being dispersed therein.

Thus obtained dispersion liquid is applied onto the conductive particle layer 12, so as to yield the conductive film layer 13. Preferably, after coating, a drying process is performed. Examples of the coating method include reverse rolling, direct rolling, blading, knifing, extrusion, nozzle method, curtaining, gravure rolling, bar coating, dipping, kiss coating, spin coating, squeezing, and spraying. The foregoing method yields the transparent conductor $2a$ shown in FIG. 2.

Thus obtained transparent conductor $2a$ can favorably be used not only in transparent electrodes for touch panels, but also in antinoise components, heating elements, electrodes for EL, electrodes for backlight, LCD, PDP, and the like.

Second Embodiment

A second embodiment of the transparent conductor in accordance with the present invention will now be explained. Constituents identical or equivalent to those in the first embodiment will be referred to with numerals identical thereto without repeating their overlapping descriptions.

Figure 3:
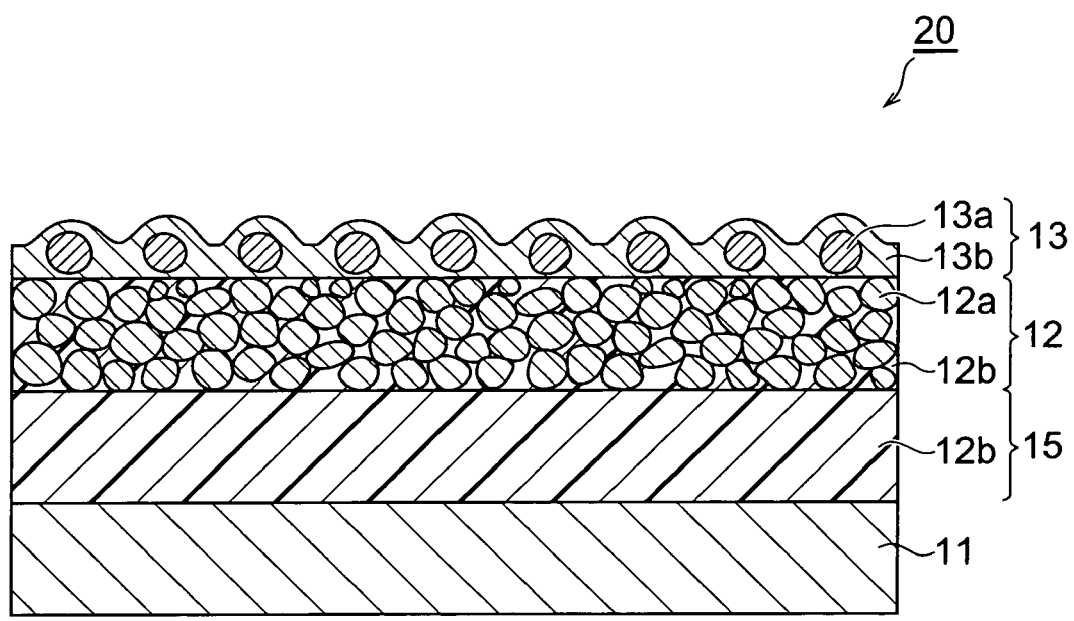
FIG. 3 is a schematic sectional view showing a second embodiment of the transparent conductor in accordance with the present invention.

FIG. 3 is a schematic sectional view showing a second embodiment of the transparent conductor in accordance with the present invention. As shown in FIG. 3, the transparent conductor 20 in accordance with this embodiment differs from the transparent conductor $2a$ in accordance with the first embodiment in that it further comprises a binder layer 15 between the support 11 and conductive particle layer 12. The binder layer 15 in accordance with the second embodiment is constructed by the first binder $12b$ contained in the above-mentioned conductive particle layer 12.

Preferably, the binder layer 15 has a refractive index of 1.6 or less. When the refractive index is less than 1.6, the reflectance becomes lower than in the case where the refractive index is 1.6 or greater, whereby the transparency tends to improve.

Preferably, the binder layer 15 has a thickness of 0.1 to 5 μm. When the thickness is 0.1 to 5 μm, the electric resistance value is more stabilized, and the transparency improves more as compared with the case where the thickness is outside of the range mentioned above.

Manufacturing Method

A method of manufacturing the transparent conductor 20 in accordance with this embodiment will now be explained.

First, conductive particles $12a$ are mounted on a substrate which is not depicted. Preferably, an anchor layer for securing the conductive particles $12a$ onto the substrate is provided beforehand on the substrate. The anchor layer provided beforehand allows the conductive particles $12a$ to be firmly fixed onto the substrate. Consequently, the conductive particles $12a$ can easily be mounted. For example, polyurethane is favorably used as the anchor layer.

For securing the conductive particles $12a$ onto the substrate, it will be preferred if the conductive particles $12a$ are compressed toward the substrate, so as to form a compressed layer. This is useful in that the conductive particles $12a$ can be attached to the substrate without forming the anchor layer. The compression can be effected by sheet pressing, roll pressing, and the like. It will also be preferred in this case if an anchor layer is provided on the substrate. This allows the conductive particles $12a$ to be secured more firmly. Not only glass, but films of polyester, polyethylene, and polypropylene, and various plastic supports, for example, are also usable as the substrate.

After thus forming the compressed layer of conductive particles 12a on the substrate, the conductive particle layer 12 and binder layer 15 are formed in this order. As the first binder 12b, one which is curable by high-energy lines which will be explained later is used. When the first binder 12b has such a high viscosity that it is hard to process, when the first binder 12b is solid, and the like, the first binder 12b is dispersed into a liquid, so as to form a dispersion liquid. Examples of the liquid for dispersing the first binder 12b include saturated hydrocarbons such as hexane; aromatic hydrocarbons such as toluene and xylene; alcohols such as methanol, ethanol, propanol, and butanol; ketones such as acetone, methylethylketone, isobutylmethylketone, and diisobutylketone; esters such as ethyl acetate and butyl acetate; ethers such as tetrahydrofuran, dioxane, and diethyl ether; and amides such as N,N-dimethylacetamide, N,N-dimethylformamide, and N-methylpyrrolidone. The first binder 12b may be dissolved in the liquid instead of being dispersed therein. Fillers and crosslinking agents may be added to the first binder 12b.

The first binder 12b or the dispersion liquid of the first binder 12b is applied onto one surface of the compressed layer. Then, a part of the first binder 12b infiltrates the compressed layer. Preferably, after coating, a drying process is performed. Examples of the coating method include reverse rolling, direct rolling, blading, knifing, extrusion, nozzle method, curtaining, gravure rolling, bar coating, dipping, kiss coating, spin coating, squeezing, and spraying.

Subsequently, a support 11 is attached onto the first binder 12b. The support 11 may be provided beforehand with an anchor layer on the surface to be attached to the first binder 12b. The anchor layer provided beforehand on the support 11 allows the first binder 12b to be fixed more firmly onto the support 11 through the anchor layer. Polyurethane and the like are favorably used as the anchor layer.

Next, high-energy lines are emitted from above the support 11 provided on the first binder 12b, so as to cure the first binder 12b and a part of the first binder 12b infiltrated in the compressed layer. Thus, the binder layer 15 and conductive particle layer 12 are formed on the support 11. When a thermoplastic resin is used as the first binder 12b, it is cured by heating. Examples of the high-energy lines include UV rays, electron beams, γ-rays, and x-rays.

Subsequently, the substrate is peeled off from the multilayer body constructed by the conductive particle layer 12, binder layer 15, and support 11. The remaining multilayer body is formed with the conductive film layer 13 as in the above-mentioned first embodiment, so as to yield the transparent conductor 20 shown in FIG. 3.

The foregoing manufacturing method manufactures the transparent conductor 30 by successively forming the conductive particle layer 12 and binder layer 15 on the substrate, attaching the support 11 to the binder layer 15, then separating the conductive particle layer 12 and the substrate from each other, and forming the conductive film layer 13 on the conductive particle layer 12. However, the transparent conductor 30 can also be obtained by successively forming the binder layer 15, conductive particle layer 12, and conductive film layer 13 on the support 11, for example.

Third Embodiment

A third embodiment of the transparent conductor in accordance with the present invention will now be explained. Constituents identical or equivalent to those in the first embodiment will be referred to with numerals identical thereto without repeating their overlapping descriptions.

Figure 4:
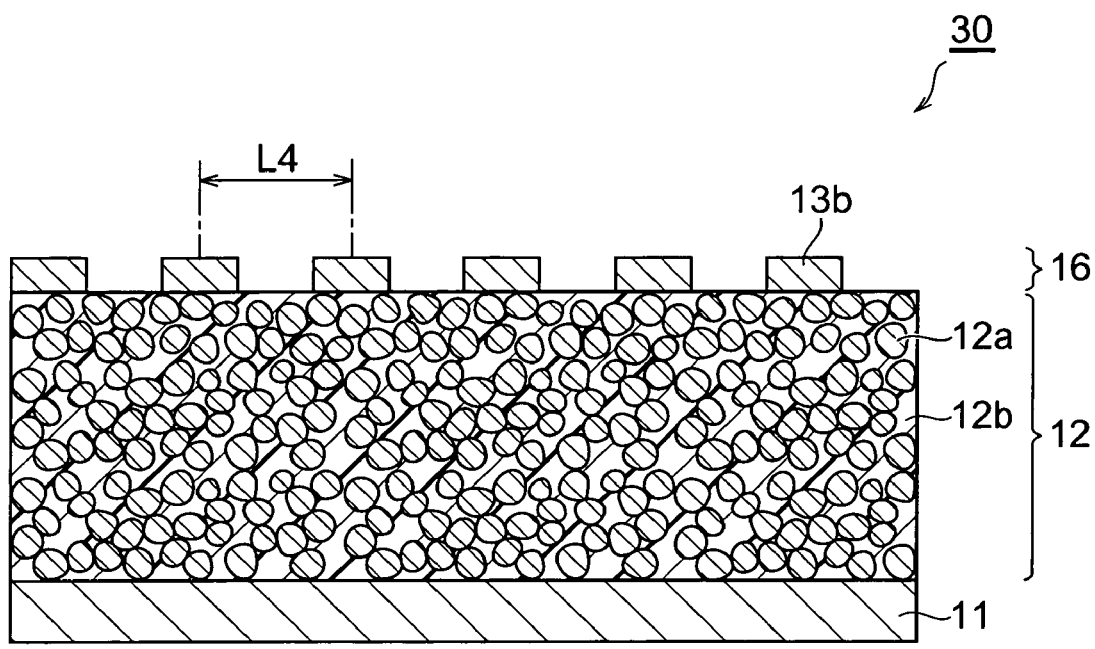
FIG. 4 is a schematic sectional view showing a third embodiment of the transparent conductor in accordance with the present invention.

FIG. 4 is a schematic sectional view showing a third embodiment of the transparent conductor in accordance with the present invention. As shown in FIG. 4, the transparent conductor 30 in accordance with this embodiment differs from the transparent conductor 2a in accordance with the first embodiment in that a conductive part 16 containing the second binder 13b is arranged like dots in place of the conductive film layer 13. The conductive part 16 in accordance with the third embodiment is constructed by the above-mentioned second binder 13b.

The transparent conductor 30 has a two-layer structure composed of a support 11 and a conductive particle layer 12, whereas the conductive part 16 is formed like dots on the side of the conductive particle layer 12 opposite from the support 11. Therefore, even when the transparent conductor 30 is distorted, or the transparent conductors 30, 2b come into contact with each other, the conductive part 16 in the transparent conductor 30 acts as a buffer material, so as to restrain the conductive particle layer 12 from breaking. Also, the conductive particle layer 12 contains fixed conductive particles 12a, whereby the transparent conductor 30 secures conductivity.

Since the conductive part 16 is arranged like dots, the transparent conductor 30 has a rough surface. Therefore, when the transparent electrode 2b is arranged so as to oppose the transparent conductor 30 by way of spacers 4, light transmitted through the transparent conductor 2b is dispersed, whereby Newton's rings are restrained from occurring. Since the conductive part 16 is laminated on the conductive particle layer 12 in this case, the transparent conductor 30 in accordance with this embodiment can keep the electric resistance value from changing even when the conductive part 16 is broken.

Preferably, in the conductive part 16, the interval L4 between adjacent dots is 10 to 200 μm on average. The interval L4 of 10 to 200 μm improves optical characteristics (transmittance and haze value) more, and more fully keeps Newton's rings from occurring as compared with the case where the interval L4 is outside of the range mentioned above.

Examples of forms of the dots include hemispheres, flat quadratic prisms, and flat cylinders.

Preferably, the conductive part 16 has a refractive index of 1.6 or less. When the refractive index is less than 1.6, the reflectance becomes lower than in the case where the refractive index is 1.6 or greater, whereby the transparency tends to improve.

Preferably, the conductive part 16 has a thickness of 0.7 to 3 μm. The thickness of 0.7 to 3 μm more fully prevents the effect of suppressing Newton's rings from decreasing and improves transparency and contactability as compared with the case where the thickness is outside of the range mentioned above.

Preferably, the conductive part 16 has a Tg of 0° C. or higher. The Tg of 0° C. or higher can maintain the morphology of the transparent conductor 30 even when the transparent conductor 30 in accordance with the present embodiment is used for a long period.

Manufacturing Method

A method of manufacturing the transparent conductor 30 in accordance with this embodiment will now be explained.

First, as in the above-mentioned first embodiment, a conductive particle layer 12 is made on a support 11. Subsequently, a conductive polymer paint is applied onto the surface of the conductive particle layer 12 by photolithography, ink jetting, screen printing, or the like. For example, Denatron (manufactured by Nagase ChemteX Corporation) which is a polythiophene-based conductive polymer is dried for 1 minute at 70° C. after being applied, and then is heat-treated for 10 minutes at 150° C. This yields the transparent conductor 30 shown in FIG. 4.

Though preferred embodiments of the present invention are explained in the foregoing, the present invention is not limited to the above-mentioned embodiments.

For example, though the conductive part 16 is arranged like dots in the third embodiment, the conductive part 16 may also be arranged like lines or grids.

EXAMPLES

The present invention will now be explained more specifically with reference to examples, which do not restrict the present invention.

Making of Conductive Particles

An aqueous solution dissolving 19.9 g of indium chloride tetrahydrate (manufactured by Kanto Chemical Co., Inc.) and 2.6 g of stannic chloride (manufactured by Kanto Chemical Co., Inc.) into 980 g of water and a 10-fold water dilution of aqueous ammonia (manufactured by Kanto Chemical Co., Inc.) were mixed while being prepared, so as to produce a white precipitate (coprecipitate).

The liquid containing thus produced precipitate was subjected to solid-liquid separation by a centrifuge, so as to yield a solid. The solid was put into 1,000 g of water, dispersed by a homogenizer, and then subjected to solid-liquid separation by the centrifuge. After performing five sets of dispersion and solid-liquid separation, the solid was dried, and then was heated for 1 hour at 600° C. in a nitrogen atmosphere, so as to yield ITO powder (conductive particles).

Example 1

A rectangular film of polyethylene terephthalate (PET) having a size of 10 cm×30 cm (as a support with a thickness of 200 μm; manufactured by Teijin Ltd.) was attached to a glass substrate with a double-sided adhesive tape, so as to secure the support made of the PET film onto the glass substrate.

Then, 36 parts by mass of polyethylene glycol diacrylate (product name: A-600 manufactured by Shin-Nakamura Chemical Co., Ltd.), 12 parts by mass of 2-hydroxy-3-phenoxypropyl acrylate (product name: 702A manufactured by Shin-Nakamura Chemical Co., Ltd.), 1 part by mass of TINUVIN 900 (benzotriazole-based UV-absorbing agent manufactured by Ciba Specialty Chemicals), and 1 part by mass of a photopolymerization initiator (ESACURE KTO46 manufactured by Lamberti S.p.A.) were mixed in 50 parts by mass of methylethylketone (MEK manufactured by Kanto Chemical Co., Inc.), so as to yield a first mixed liquid.

The first mixed liquid was applied by bar coating onto the support such as to yield a thickness of 10 μm after curing, and was cured upon UV irradiation with an integrated illuminance of 1,000 mJ/cm$^2$ by using a high-pressure mercury lamp as a light source, so as to form a binder layer.

Next, 150 parts by mass of the ITO powder (having an average particle size of 30 nm), 20 parts by mass of ethoxylated bisphenol A diacrylate (product name: A-BPE-20 manufactured by Shin-Nakamura Chemical Co., Ltd.), 35 parts by mass of polyethylene glycol dimethacrylate (product name: 14G manufactured by Shin-Nakamura Chemical Co., Ltd.), 25 parts by mass of 2-hydroxy-3-phenoxypropyl acrylate (product name: 702A manufactured by Shin-Nakamura Chemical Co., Ltd.), 10 parts by mass of a urethane-modified acrylate (product name: UA-512 manufactured by Shin-Nakamura Chemical Co., Ltd.), 10 parts by mass of an acrylic polymer (with an average molecular weight of about 50,000, having 50 acryloyl groups and 25 triethoxysilane groups on average per molecule), 1 part by mass of TINUVIN 123 (hindered-amine-based light stabilizer manufactured by Ciba Specialty Chemicals), and 2 parts by mass of photopolymerization initiator (ESACURE KTO46 manufactured by Lamberti S.p.A.) were mixed in 50 parts by mass of methylethylketone (MEK manufactured by Kanto Chemical Co., Inc.), so as to yield a second mixed liquid.

The second mixed liquid was applied by bar coating onto the binder layer such as to yield a thickness of 50 μm after curing, and was cured upon UV irradiation with an integrated illuminance of 3,000 mJ/cm$^2$ by using a high-pressure mercury lamp as a light source, so as to form a conductive particle layer.

Next, 50 parts by mass of Denatron 4001 (having a solid content of 1.5 wt %; manufactured by Nagase ChemteX Corporation), 1 part by mass of a crosslinking agent (product name: M-400 manufactured by Nagase ChemteX Corporation), and 0.1 part by mass of polystyrene beads (having a diameter of 5 μm; product name: SX-500H manufactured by Soken Chemical & Engineering Co., Ltd.) were mixed, so as to yield a third mixed liquid.

The third mixed liquid was applied by bar coating onto the surface of the conductive particle layer such as to yield a thickness of 2 μm after curing, and then was cured for 10 minutes in an oven at 150° C., so as to form a conductive film layer. Thereafter, the glass substrate was separated from the support, so as to yield a transparent conductor.

Example 2

A transparent conductor was obtained as in Example 1 except that the diameter of polystyrene beads in Example 1 was changed to 3.5 μm (product name: SX-350H manufactured by Soken Chemical & Engineering Co., Ltd.).

Example 3

A transparent conductor was obtained as in Example 1 except that the polystyrene beads in Example 1 were changed to acrylic beads containing a soft urethane-modified acrylate having a diameter of 3.5 μm.

Example 4

A transparent conductor was obtained as in Example 1 except that the polystyrene beads in Example 1 were changed to silica beads having a diameter of 3.5 μm.

Example 5

In the forming of the conductive film layer in Example 1, the third mixed liquid was applied onto the conductive particle layer several times by ink jetting instead of bar coating such as to yield a dot diameter of 3 μm, a dot thickness of 2 μm, and a dot interval of 50 μm, and then was cured for 10 minutes in an oven at 150° C., so as to form a dot-shaped conductive part. Then, the glass substrate was separated from the support, so as to yield a transparent conductor.

Comparative Example 1

A commercially available ITO-sputtered film comprising an acrylic resin layer containing silica beads having an average particle size of 3.5 μm formed on a PET film surface, a sputtered silica layer formed on the acrylic resin layer surface, and an ITO layer formed on the silica layer surface was employed as a transparent conductor of Comparative Example 1.

Comparative Example 2

A transparent conductor was obtained as in Example 1 except that the polystyrene beads of Example 1 were not used.

Evaluation Method

Change in Electric Resistance Value after Point Loading

In the following manner, electric resistance was evaluated in the transparent conductors obtained in Examples 1 to 5 and Comparative Examples 1 and 2. The transparent conductors obtained as mentioned above were each cut into a 50-mm square, electrodes were formed by a width of 5 mm each from a given pair of opposing end faces on the surface of its conductive film layer by a conductive paste made of silver, and a digital multimeter (PC5000 manufactured by Sanwa Electric Instrument Co., Ltd.) was connected between the electrodes. The resistance value between end parts was measured and taken as an initial resistance value.

Further, double-sided adhesive tapes each having a size of 5 mm×45 mm were attached to all the edge parts on the surface of the conductive film layer. On the other hand, an ITO-sputtered glass sheet in a 50-mm square form was prepared. Subsequently, spacers each having a size of 5 mm×45 mm with a thickness of 100 μm were bonded to all the edge parts of the ITO surface (surface formed with the ITO electrodes) with a double-sided adhesive tape. Then, the double sided adhesive tapes attached to the surface of the conductive film layer and the spacers attached to the ITO surface were bonded together such that their positions did not shift from each other, whereby a touch panel was obtained.

A load of 100 g at 2 Hz was vertically applied at random to the surface of the conductive film layer of the transparent conductor at substantially the center part thereof with a silicon rubber piece having a leading end part in an R8 form in an environment at 25° C., 50% RH. After repeating this operation 10,000 times, the resistance value between the end parts of the transparent conductor was measured by the above-mentioned digital multimeter. Using thus measured value as an afterload resistance value, the ratio of change was calculated according to the following expression:

Ratio of change=afterload resistance value/initial resistance value.

Table 1 shows thus obtained results. In Table 1, "beyond upper limit" refers to a state where cracks occurred, thereby raising the electric resistance value so much that it was not measurable.

Visual Evaluation

A load of 200 g was vertically applied to the surface of the conductive film layer of the transparent conductor at the center part thereof with a silicon rubber piece having a leading end part in an R8 form. Whether there were Newton's rings (NR) or not at that time was visually observed. Table 1 shows thus obtained results.

TABLE 1

|  | NR | INITIAL RESISTANCE VALUE kΩ/□ | AFTERLOAD RESISTANCE VALUE kΩ/□ | RATIO OF CHANGE |
| --- | --- | --- | --- | --- |
| EXAMPLE 1 | NO | 4.12 | 4.33 | 1.05 |
| EXAMPLE 2 | NO | 3.86 | 4.01 | 1.04 |

TABLE 1-continued

|  | NR | INITIAL RESISTANCE VALUE kΩ/□ | AFTERLOAD RESISTANCE VALUE kΩ/□ | RATIO OF CHANGE |
| --- | --- | --- | --- | --- |
| EXAMPLE 3 | NO | 4.64 | 4.78 | 1.03 |
| EXAMPLE 4 | NO | 3.91 | 4.30 | 1.10 |
| EXAMPLE 5 | NO | 4.27 | 4.48 | 1.05 |
| COMPARATIVE EXAMPLE 1 | NO | 0.77 | BEYOND UPPER LIMIT | — |
| COMPARATIVE EXAMPLE 1 | YES | 4.52 | 4.61 | 1.02 |

As Table 1 clearly shows, it was found that Examples 1 to 5 did not generate Newton's rings as compared with Comparative Example 2, and the ratio of change in their electric resistance values was small even after point loading. The foregoing results have verified that the transparent conductor of the present invention can restrain Newton's rings from occurring and suppress the change in electric resistance value.

What is claimed is:

1. A transparent conductor comprising a successive lamination of:
    a support;
    a conductive particle layer containing a conductive particle and a first binder, the conductive particle being fixed by curing the first binder so as to form the conductive particle layer; and
    a conductive film layer containing a bead and a second binder, the bead being fixed by curing the second binder so as to form the conductive film layer, wherein
    a surface of the conductive film layer opposite from the conductive particle layer is rough,
    the bead comprises a resin,
    the first binder comprises at least one of an acrylic resin and an epoxy resin, and
    the second binder comprises at least one of polyacetylene, polypyrrole, polythiophene, polyphenylenevinylene, polyphenylene, polysilane, polyfluorene and polyaniline.

2. A transparent conductor according to claim 1, wherein the resin comprises a conductive polymer.

3. A transparent conductor according to claim 2, wherein the second binder comprises a conductive polymer.

4. A panel switch comprising:
    a pair of transparent conductors opposing each other; and
    a plurality of spacers provided between the pair of transparent conductors;
    wherein at least one of the pair of transparent conductors is the transparent conductor according to claim 3.

5. A panel switch comprising:
    a pair of transparent conductors opposing each other; and
    a plurality of spacers provided between the pair of transparent conductors;
    wherein at least one of the pair of transparent conductors is the transparent conductor according to claim 2.

6. A transparent conductor according to claim 1, wherein the second binder comprises a conductive polymer.

7. A panel switch comprising:
    a pair of transparent conductors opposing each other; and
    a plurality of spacers provided between the pair of transparent conductors;
    wherein at least one of the pair of transparent conductors is the transparent conductor according to claim 6.

8. A panel switch comprising:

a pair of transparent conductors opposing each other; and a plurality of spacers provided between the pair of transparent conductors;

wherein at least one of the pair of transparent conductors is the transparent conductor according to claim 1.

9. A transparent conductor comprising a successive lamination of:

a support;

a conductive particle layer containing a conductive particle and a first binder, the conductive particle being fixed by curing the first binder so as to form the conductive particle layer; and a conductive film layer containing a bead and a second binder, the bead being fixed by curing the second binder so as to form the conductive film layer, wherein a surface of the conductive film layer opposite from the conductive particle layer is rough, the second binder comprises a conductive polymer, the conductive polymer being at least one of polyacetylene, polypyrrole, polythiophene, polyphenylenevinylene, polyphenylene, polysilane, polyfluorene and polyaniline, and the first binder comprises at least one of an acrylic resin and an epoxy resin.

10. A panel switch comprising:

a pair of transparent conductors opposing each other; and a plurality of spacers provided between the pair of transparent conductors;

wherein at least one of the pair of transparent conductors is the transparent conductor according to claim 9.

11. A panel switch comprising:

a pair of transparent conductors opposing each other; and a plurality of spacers provided between the pair of transparent conductors;

wherein at least one of the pair of transparent conductors comprises a successive lamination of:

a support;

a conductive particle layer containing a conductive particle and a first binder, the conductive particle being fixed by curing the first binder so as to form the conductive particle layer; and a conductive film layer containing a bead and a second binder, the bead being fixed by curing the second binder so as to form the conductive film layer, wherein a surface of the conductive film layer opposite from the conductive particle layer is rough, the first binder comprises at least one of an acrylic resin and an epoxy resin, and the second binder comprises at least one of polyacetylene, polypyrrole, polythiophene, polyphenylenevinylene, polyphenylene, polysilane, polyfluorene and polyaniline.

12. A panel switch according to claim 11, wherein a plurality of beads and spacers are arranged at respective fixed intervals; and wherein the interval between the beads is shorter than the interval between the spacers.

* * * * *